United States Patent
Schuette

(10) Patent No.: US 8,561,673 B2
(45) Date of Patent: Oct. 22, 2013

(54) SEALED SELF-CONTAINED FLUIDIC COOLING DEVICE

(75) Inventor: Franz Michael Schuette, Colorado Springs, CO (US)

(73) Assignee: Olantra Fund X L.L.C., Wilmington, DE (US)

( * ) Notice: Subject to any disclaimer, the term of this patent is extended or adjusted under 35 U.S.C. 154(b) by 1680 days.

(21) Appl. No.: 11/861,810

(22) Filed: Sep. 26, 2007

(65) Prior Publication Data

US 2008/0073062 A1   Mar. 27, 2008

Related U.S. Application Data

(60) Provisional application No. 60/826,939, filed on Sep. 26, 2006.

(51) Int. Cl.
 *F28D 15/00* (2006.01)
 *H05K 7/20* (2006.01)

(52) U.S. Cl.
 USPC ............ 165/104.22; 165/104.24; 165/104.25; 165/104.26; 165/104.33; 361/700

(58) Field of Classification Search
 USPC ............ 165/104.21, 104.22, 104.24, 104.26, 165/104.25, 104.33; 361/700
 See application file for complete search history.

(56) References Cited

U.S. PATENT DOCUMENTS

| | | | |
|---|---|---|---|
| 4,450,472 A | 5/1984 | Tuckerman et al. | |
| 5,000,256 A * | 3/1991 | Tousignant | 165/104.33 |
| 5,427,174 A * | 6/1995 | Lomolino et al. | 165/104.26 |
| 5,801,442 A | 9/1998 | Hamilton et al. | |
| 6,019,165 A * | 2/2000 | Batchelder | 165/104.33 |
| 6,082,443 A * | 7/2000 | Yamamoto et al. | 165/104.26 |
| 6,672,502 B1 | 1/2004 | Paul et al. | |
| 6,675,875 B1 | 1/2004 | Vafai et al. | |
| 6,679,318 B2 * | 1/2004 | Bakke | 165/104.26 |
| 6,692,700 B2 | 2/2004 | Handique | |
| 6,739,831 B2 | 5/2004 | Hsu et al. | |
| 6,782,942 B1 * | 8/2004 | Wang et al. | 165/104.26 |
| 6,785,134 B2 | 8/2004 | Maveety et al. | |
| 6,812,563 B2 | 11/2004 | Go et al. | |
| 6,840,311 B2 * | 1/2005 | Ghosh et al. | 165/104.33 |
| 6,901,994 B1 * | 6/2005 | Jin-Cherng et al. | 165/104.26 |
| 6,904,966 B2 | 6/2005 | Philpott et al. | |
| 6,934,154 B2 | 8/2005 | Prasher et al. | |
| 6,942,018 B2 | 9/2005 | Goodson et al. | |
| 6,989,134 B2 | 1/2006 | Tonkovich et al. | |
| 6,991,024 B2 | 1/2006 | Goodson et al. | |
| 7,000,684 B2 | 2/2006 | Kenny et al. | |
| 7,219,715 B2 | 5/2007 | Popovich | |
| 7,306,027 B2 * | 12/2007 | Whitney et al. | 165/104.21 |
| 7,422,053 B2 * | 9/2008 | Siu | 165/104.26 |

(Continued)

*Primary Examiner* — Ljiljana Ciric

(74) *Attorney, Agent, or Firm* — Knobbe, Martens, Olson & Bear, LLP

(57) ABSTRACT

A cooling system and method for cooling electronic components. The cooling system employs a cooling device that includes a composite structure having first and second plates arranged substantially in parallel and bonded together to define a sealed cavity therebetween. The first plate has a surface that defines an outer surface of the composite structure and is adapted for thermal contact with at least one electronic component. A mesh of interwoven strands is disposed within the cavity and lies in a plane substantially parallel to the first and second plates. A fluid is contained and sealed within the cavity of the composite structure, and is pumped through interstices defined by and between the strands of the mesh. Flow dividers can define interconnected channels within the cavity.

18 Claims, 4 Drawing Sheets

(56) References Cited

U.S. PATENT DOCUMENTS

| | | | |
|---|---|---|---|
| 7,770,630 B2* | 8/2010 | Chesser et al. | 165/104.33 |
| 7,956,278 B1* | 6/2011 | Popovich | 136/246 |
| 7,965,511 B2* | 6/2011 | Refai-Ahmed | 361/700 |
| 2001/0004934 A1* | 6/2001 | Yamamoto et al. | 165/104.11 |
| 2004/0163798 A1* | 8/2004 | Ghosh et al. | 165/104.21 |
| 2005/0173096 A1* | 8/2005 | Hsu et al. | 165/104.21 |
| 2007/0107875 A1* | 5/2007 | Lee et al. | 165/104.26 |
| 2008/0190586 A1* | 8/2008 | Robinson | 165/80.4 |

* cited by examiner

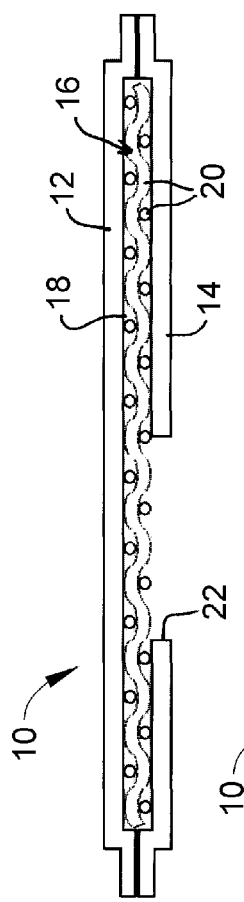
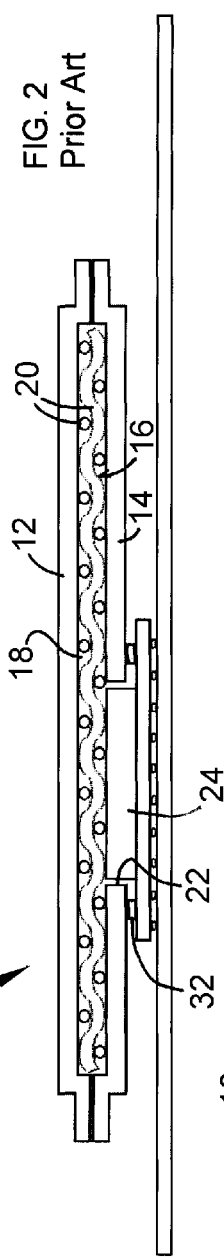
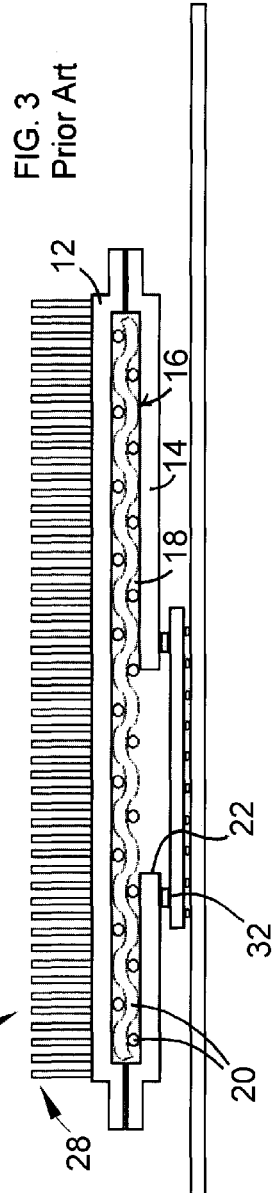
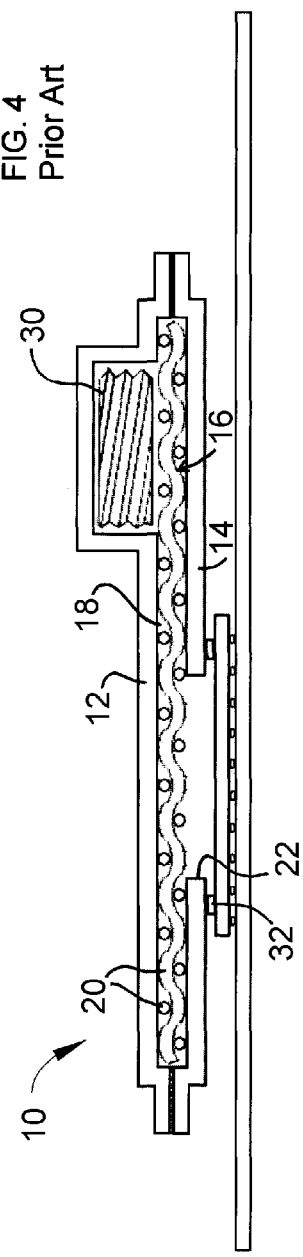

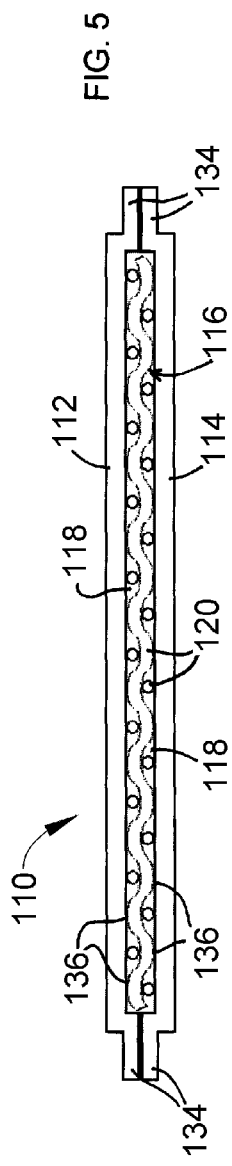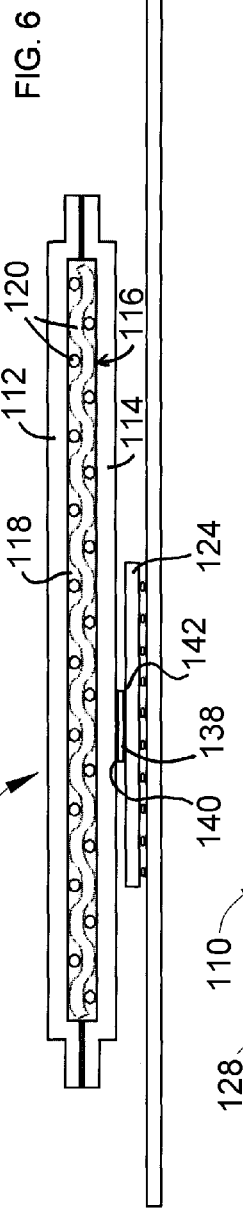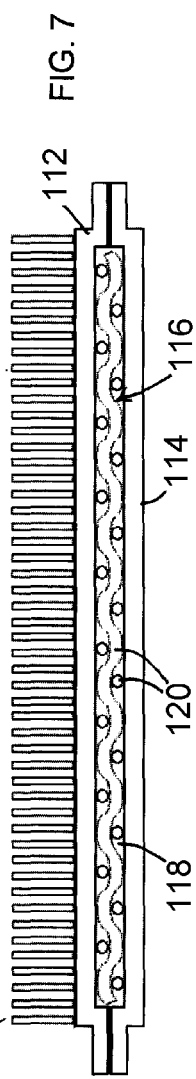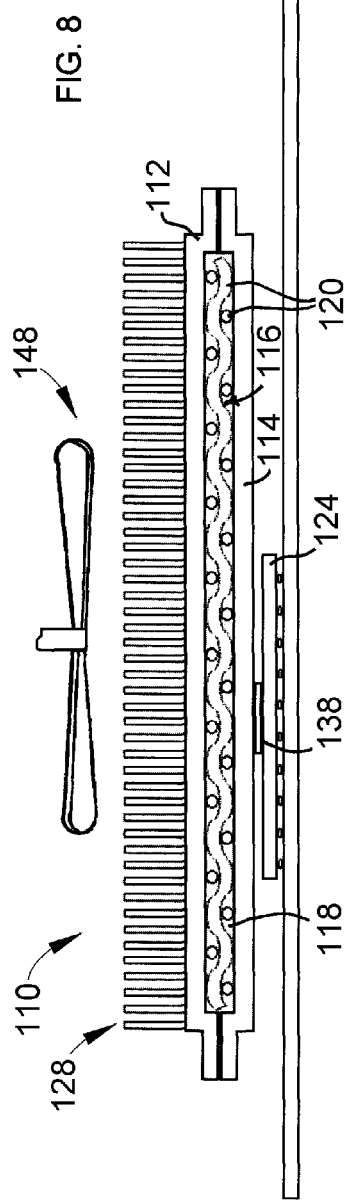

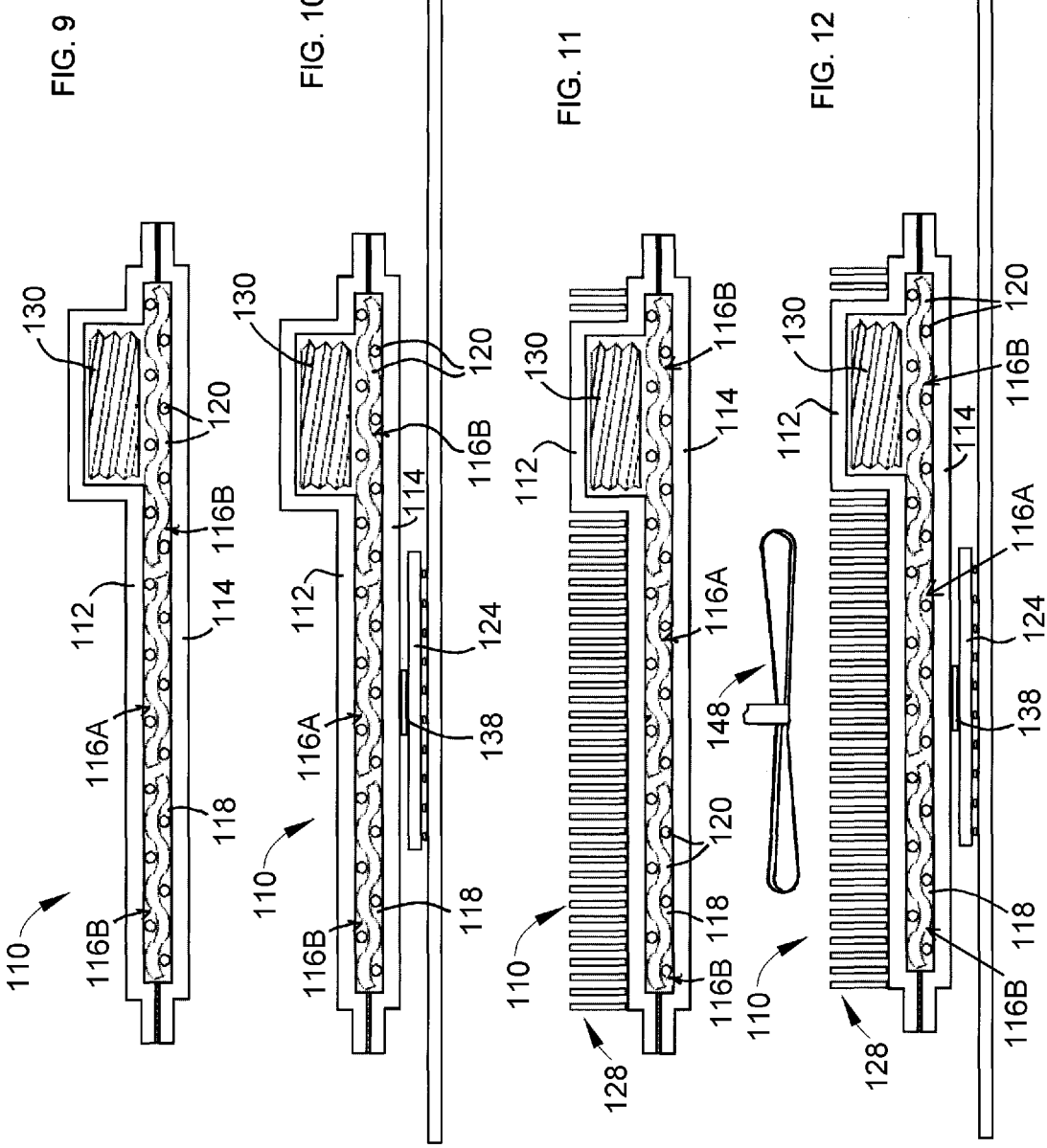

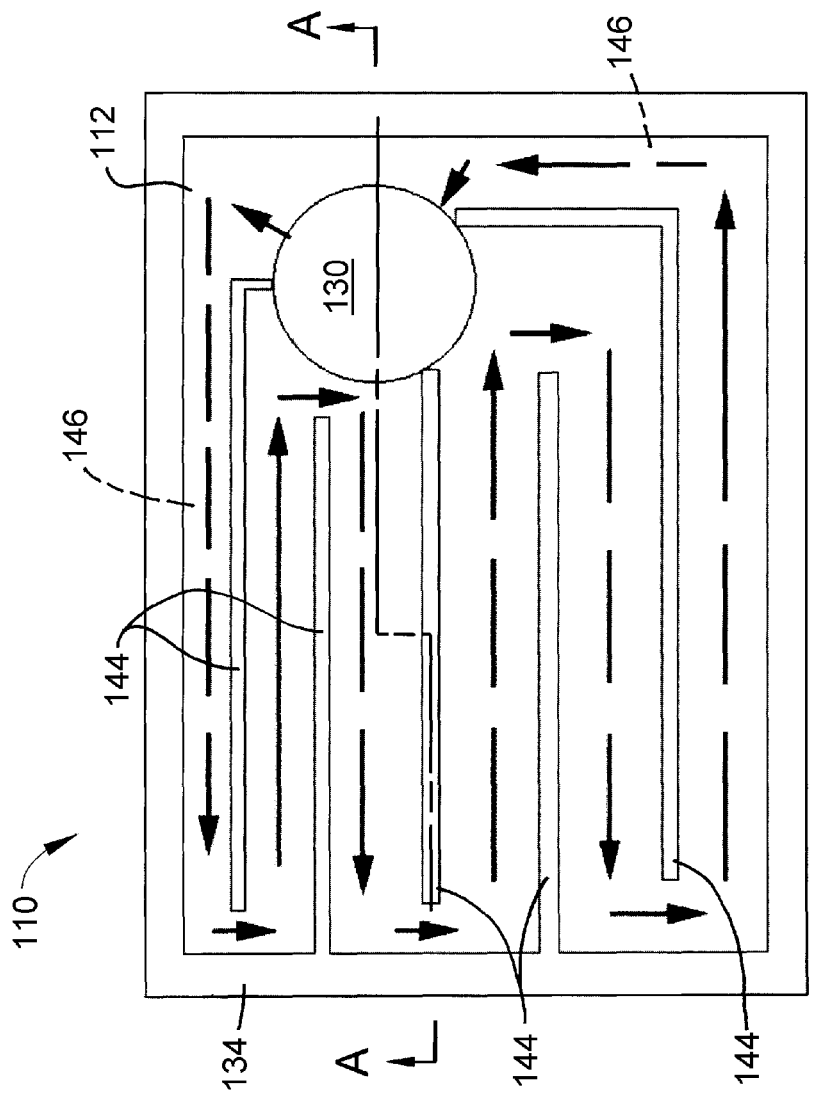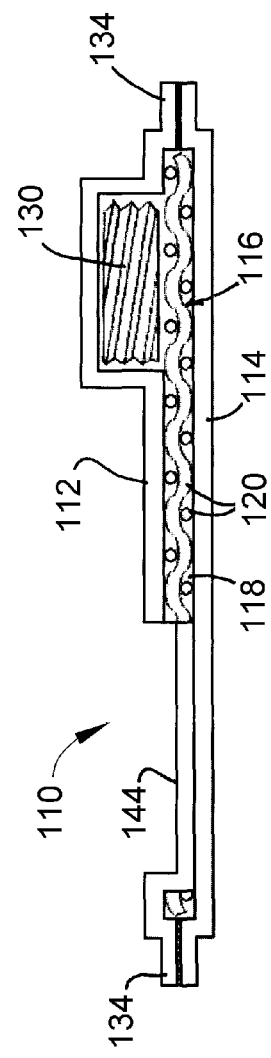
FIG. 13
FIG. 14

SEALED SELF-CONTAINED FLUIDIC COOLING DEVICE

CROSS REFERENCE TO RELATED APPLICATIONS

This application claims the benefit of U.S. Provisional Application No. 60/826,939, filed Sep. 26, 2006, the contents of which are incorporated herein by reference.

BACKGROUND OF THE INVENTION

The present invention generally relates to cooling systems for electronic components. More particularly, this invention relates to a sealed cooling device that contains a fluid and a mesh material through which the fluid flows to promote heat transfer through the device.

Cooling of electronic devices has become increasingly challenging as electronics have evolved. As manufacturing processes are constantly refined, the migration to smaller design processes and the incumbent reduction in operating voltage has not kept pace with the increased complexity of faster integrated circuits (ICs). Increasing number of transistors in combination with increasing operating frequencies has resulted in higher numbers of switching events over time per device. As a result, within the same market space and price range, ICs are becoming more and more sophisticated and power-hungry with every generation.

Compared to earlier generations, the implementation of smaller design processes has allowed the integration of more electronic building blocks such as transistors and capacitors on the same footprint. Consequently, area power densities have increased, resulting in smaller dies dissipating higher thermal load. As a result, formerly sufficient, passive heat spreaders and coolers often do not provide adequate cooling. While sophisticated fin designs and powerful fans increase the active surface area useable for offloading thermal energy to the environment, even extremely well designed coolers are hitting inherent limitations. In particular, significant limitations stem from the bottleneck of limited heat conductivity of the materials used, and specifically the fact that passive heat transfer throughout a solid structure is limited by the thermal conductance coefficient of the material and the cross sectional area of the structure.

In a two-dimensional heat spreader of uniform thickness, the amount of heat energy decreases as a square function of the distance from the source, where the thermal conductance coefficient of the material and the cross sectional area define the slope of the decrease. Therefore, even the most highly conductive material will not be able to maintain an even temperature distribution across the entire surface of the cooling device. Any gradient, on the other hand, will cause a decrease in cooling efficiency since the temperature difference ($\Delta T$) between the cooler's surface and the environment is the primary limiting factor for thermal dissipation to the surrounding.

In view of the above, it is desired that coolers transfer heat from a heat source as quickly and efficiently as possible to provide a uniform temperature distribution or isothermicity at the cooler's surface. In combustion engines, liquid cooling has become the method of choice, using the fact that a liquid (e.g., water) is taking up thermal energy and subsequently being pumped to a remote radiator where it releases the absorbed heat. In electronic devices, liquid cooling is still only marginally accepted for reasons that include the inherent risk of spills, cost overhead, and complexity of the installation, which involves routing of tubing and installation of radiators. Alternatively, some self-contained liquid cooling devices have been proposed and marketed.

The four primary factors defining the efficacy of a liquid cooling device are the uptake of heat by the cooling fluid at the heat source, the transport rate of the fluid away from the heat source, the offloading of heat to the solid components of the cooler, and finally the dissipation rate of heat into the environment. The exchange of heat between the fluid and the cooling device largely depends on the routing of the flow of the coolant within the device. If the channels are too wide, laminar flow can cause a decrease in efficacy of heat exchange between the fluid and the device. Therefore, it is desirable to have a capillary system to achieve an optimal surface to volume ratio. Such capillary systems have been referred to as microchannel systems.

Different technologies have been employed to create microchannels, including etching and crosshatching of small grooves into a cooling device and even into the die of an electronic device to be cooled, such technologies have required relatively elaborate steps in their design and manufacturing process. Commonly-assigned U.S. Pat. No. 7,219,715 to Popovich, the contents of which are incorporated herein by reference, describes an alternative approach using a mesh or woven screen that is between and bonded to two foils that define a flow cavity. A generic representation of this type of approach is depicted by a cooling device 10 shown in FIG. 1, in which a pair of foils 12 and 14 are bonded together, and a mesh 16 is contained within a cavity 18 defined by and between the foils 12 and 14. The interstices between the warp and weft strands 20 of the mesh 16, as well as the gaps between the strands 20 and the bordering foils 12 and 14, allow the passage of a cooling fluid, providing direct contact with the fluid for heat absorption and transfer heat through the bonding contacts with the foils 12 and 14. As further represented in FIG. 2, Popovich also provides an opening 22 in one of the foils 14 that provides for direct contact of the cooling fluid within the device 10 with the die 24 of an IC device, which is represented in FIG. 2 as projecting into the cavity 18 through the opening 22. FIGS. 3 through 4 represent variations of the cooling device 10 of FIG. 1. In FIG. 3, the device 10 is modified to include cooling fins 28 that promote heat dissipation to the surrounding environment. In FIG. 4, the device 10 is modified to include an integrated pump 30 for forcing the flow of the cooling fluid within the device 10. As would be expected, the fins 28 of FIG. 3 and the pump 30 of FIG. 4 can also be combined in the same cooling device 10.

An advantage of the cooling devices represented in FIGS. 1 through 4 is attributable to the tortuous course of the microchannels through the mesh 16, meaning that in addition to an X-Y labyrinth of interstices, a Z-plane of tortuousness is created that further increases the internal surface area for heat exchange between the fluid and the solid components of the cooling device 10.

Though the approach represented in FIGS. 1 through 4 is thermally efficient, exposure of the IC die 24 to the cooling fluid requires a sealing feature 32 (such as an adhesive seal, O-ring, etc.) around the opening 22 in the cavity 18 to allow direct fluid passage over the die 24. Aside from any potential reliability problems, the requirement for a sealing feature 32 can complicate the serviceability of the cooling device 10, and may render the device 10 ill-suited for aftermarket retrofitting by certain end users with limited technical skills.

In addition to Popovich, the use of microchannels for coolant fluids has been known for some time, as evidenced by U.S. Pat. No. 4,450,472 to Tuckerman et al. The preferred embodiment featured in this patent integrated microchannels into the die of the microchip to be cooled and coolant chambers. U.S.

Pat. No. 5,801,442 also describes a similar approach. Still other approaches have focused on the combined use of coolant phase change (condensation) and microchannels, an example of which is U.S. Pat. No. 6,812,563. U.S. Pat. No. 6,934,154 describes a similar two-phase approach including an enhanced interface between an IC die and a heatspreader based on a flip-chip design and the use of a thermal interface material. U.S. Pat. Nos. 6,991,024, 6,942,018, and 6,785,134 describe electroosmotic pump mechanisms and vertical channels for increased heat transfer efficiencies. Variations of microchannel designs include vertical stacking of different orientational channel blocks as described in U.S. Pat. No. 6,675,875, flexible microchannel designs using patterned polyimide sheets as described in U.S. Pat. No. 6,904,966, and integrated heating/cooling pads for thermal regulation as described in U.S. Pat. No. 6,692,700.

Additional efforts have been directed to the manufacturing of microchannels. U.S. Pat. Nos. 7,000,684, 6,793,831, 6,672,502, and 6,989,134 are representative examples, and disclose forming microchannels by sawing, stamping, cross-cutting, laser drilling, soft lithography, injection molding, electrodeposition, microetching, photoablation chemical micromachining, electrochemical micromachining, through-mask electrochemical micromachining, plasma etching, water jet, abrasive water jet, electrodischarge machining (EDM), pressing, folding, twisting, stretching, shrinking, deforming, and combinations thereof. All of these methods, however, share the drawback of requiring a more or less elaborate and expensive manufacturing process.

BRIEF SUMMARY OF THE INVENTION

The present invention is a cooling system and method for cooling electronic components, including IC dies. The cooling system employs a cooling device that includes a composite structure comprising first and second plates arranged substantially in parallel and bonded together to define a sealed cavity therebetween. At least one of the first and second plates has a surface that defines an outer surface of the composite structure and is adapted for thermal contact with at least one electronic component. At least one and preferably multiple separate meshes, each of interwoven strands, are disposed within the cavity and lie in a plane substantially parallel to the first and second plates, with their strands bonded to the first and second plates. A fluid is contained and sealed within the cavity of the composite structure, and flows through interstices defined by and between the strands of the meshes.

The cooling method entails absorbing heat dissipated by an electronic component with a first plate arranged substantially in parallel and bonded to a second plate so as to define a composite structure and a sealed cavity between the first and second plates. The first plate has a surface that defines an outer surface of the composite structure and is adapted for thermal contact with the electronic component. The absorbed heat is transferred through the cavity and into the second plate via a fluid and at least one mesh contained in the cavity. The mesh lies in a plane substantially parallel to the first and second plates, and comprises interwoven strands that are bonded to the first and second plates and define interstices through which the fluid is able to flow. The fluid acts as a secondary heat absorbent and a thermal transport media that transports thermal energy to the mesh at a distance from the first plate. After traveling through the cavity, the absorbed heat is dissipated to the environment with the second plate.

In a preferred embodiment, the cooling device has a plate-mesh-plate laminate construction, in which portions of the plates, preferably including their edges, are raised so that by laminating the plates together a channel system is defined between the plates. At least one of the plates is preferably configured to define first order channels or macrochannels within the cooling device in order to direct the general flow of a cooling fluid through the channel system between the plates. Fluid movement through the channel system can be augmented by a pump.

Within the channel system, a tortuous three-dimensional labyrinth of microchannels is established by interstices between strands of the one or more meshes. The meshes are preferably bonded to each of the plates at substantially every bump of each strand resulting from the strands passing over and under transverse strands of each mesh. Difficulties associated with directly contacting an electronic component with a cooling fluid are overcome by hermetically sealing the cooling device to prevent contact between the cooling fluid and an electronic component cooled by the cooling device, and then thermally contacting the electronic device with one of the plates or a heat-slug formed as part of the plate or as a separate component attached to the plate.

According to a preferred aspect of the invention, the hermetical seal establishes a self-contained, spill-proof, and leak-proof cooling system that can easily be adapted to fit any heat source, while maintaining the advantages of a sealed system. The potential drawback of reduced efficacy of heat uptake compared to a fully immersed IC die can be considered relatively minor compared to the limitations posed by the overall rate of thermal dissipation to the environment that can result in a thermal saturation of the entire cooling apparatus. Additional advantages of the invention include rapid heat distribution throughout the entire cooling device, uncomplicated installation and maintenance, cost-effectiveness, and good scalability that allows for large-scale cooling devices.

Other objects and advantages of this invention will be better appreciated from the following detailed description.

BRIEF DESCRIPTION OF THE DRAWINGS

FIG. 1 represents an open cooling device for fluid immersion of an electronic device in accordance with the prior art.

FIG. 2 shows the cooling device of FIG. 1 mounted and sealed with an electronic device to be cooled.

FIGS. 3 and 4 show prior art cooling devices mounted and sealed with electronic devices in a manner similar to that shown in FIG. 2, but further equipped with, respectively, cooling fins to provide increased surface area for promoting heat dissipation and an integrated pump for fluid displacement.

FIG. 5 represents a first embodiment of a cooling device of the present invention, in which the device defines a completely sealed enclosure between a pair of bonded plates, and has a mesh material within the enclosure and bonded to the plates.

FIG. 6 shows the device of FIG. 5 mounted to an electronic device to be cooled.

FIG. 7 shows a cooling device equipped with cooling fins that provide increased surface area for promoting heat dissipation in accordance with a second embodiment of the invention.

FIG. 8 shows the cooling device of FIG. 7 mounted to an electronic device in a manner similar to that shown in FIG. 6.

FIG. 9 shows a cooling device with an integrated pump for fluid displacement in accordance with a third embodiment of the invention.

FIG. 10 shows the cooling device of FIG. 9 mounted to an electronic device in a manner similar to that shown in FIG. 6.

FIG. 11 shows a cooling device that includes an integrated pump as shown in FIG. 9 and cooling fins as shown in FIG. 7 in accordance with a fourth embodiment of the invention.

FIG. 12 shows the cooling device of FIG. 11 mounted to an electronic device in a manner similar to that shown in FIG. 6.

FIG. 13 shows a top view of a cooling device equipped with a pump, and embossed regions that define partitions within the cooling device to direct fluid flow in macrochannels within the device in accordance with a fifth embodiment of the invention.

FIG. 14 is a cross-sectional view of FIG. 13 along section line A-A.

DETAILED DESCRIPTION OF THE INVENTION

The present invention provides a self-contained, closed-loop fluid cooling device suitable for cooling a wide variety of electronic components, including those with high power densities such as microprocessors and power conversion devices used in computers. FIG. 5 represents a cooling device 110 of this invention comprising an isothermal plate 111 having a composite construction, in which a relatively pliant mesh 116 is sandwiched between two foils or plates 112 and 114 that are substantially parallel to each other. The mesh 116 is represented as being composed of individual strands 120 that are woven together, generally transverse to each other and conventionally referred to as warp and weft strands 120. The mesh 116 and plates 112 and 114 are preferably formed of materials having physically and chemically compatible properties, including materials having the same composition, though various material combinations are possible. For example, individual strands 120 of the mesh 116 can be formed by an individual wire, braided wires, bundled wires, etc., of copper, silver, aluminum, carbon, or alloys thereof, and the plates 112 and 114 can be formed of the same or similar materials. As discussed below, heat transfer occurs by conduction through the plates 112 and 114 and mesh 116, such that preferred materials for these components are thermally conductive, though the use of other materials including polymeric and nonmetallic materials is also foreseeable. Suitable thicknesses for the plates 112 and 114 and mesh 116, suitable cross-sectional shapes and dimensions for the mesh strands 120, and suitable weaves (including strands per inch) for the mesh 116 may depend on the particular application and the materials from which these components are formed.

As evident from FIG. 5, the peripheral edges 134 of both plates 112 and 114 are preferably raised relative to the remainder of the plates 112 and 114, such as by embossing, to form a relief in each plate 112 and 114 that promotes the rigidity of the plates 112 and 114 and further defines a continuous peripheral surface at which the plates 112 and 114 can be bonded to each other, such as with a solder alloy, braze alloy, adhesive, etc. With the plates 112 and 114 laminated together, the reliefs define a cavity 118 between the plates 112 and 114. As will be discussed in reference to FIGS. 13 and 14, additional embossing can be performed on one or both plates 112 and 114 to define within the cavity 118 a channel system between the plates 112 and 114, by which particular flow routes can be established within the device 110. Three-dimensional structures formed by such additional embossing have the further advantage of increasing the mechanical stability of the cooling device 110.

As evident from FIG. 5, the mesh 116 within the cavity 118 of the composite plate 111 may have approximately the same thickness as the height of the cavity 118 (as measured in the direction normal to the plane of the plate 111). The peaks 136 projecting from both sides of the mesh 116 are preferably bonded, such as by soldering or brazing, to the plates 112 and 114 to establish a highly-conductive thermal contact between the mesh 116 and both plates 112 and 114. Bonding also serves to cross-link the plates 112 and 114, which resists any shearing forces to which the plates 112 and 114 are subjected and contributes additional mechanical stability and rigidity to the plate 111. The warp and weft strands 120 of the mesh 116 form interstices that are more or less freely penetrable by any fluid, yet define tortuous paths that avoid laminar flow conditions within the cavity 118 that would reduce the heat transfer rate between the cooling fluid, the plates 112 and 114, and the mesh 116. Assuming the plate 114 is in thermal contact with a heat source, e.g., an electronic component 124 shown in FIG. 6, heat transfer from the component 124 is through the plate 114, through the cavity 118 containing the mesh 116 and fluid, and then through the plate 114, from whose outer surface heat is dissipated by convection. More particularly, heat transfer through the cooling device 110 is by thermal conduction through the plate 114, the mesh 116, and then the plate 112, and by convention between the plate 114 and the cooling fluid and between the cooling fluid and the plate 112, as well as convection through the cooling fluid from the plate 114 to the mesh 116 and convection through the cooling fluid from the mesh 116 to the plate 112. Accordingly, heat transfer is generally in a single direction through the thickness of the composite plate 111, and the fluid acts as a secondary heat absorbent and a thermal transport media capable of transporting thermal energy to the mesh 116 at a distance from the plate 114.

As generally known in the art, suitable coolant fluids include liquids such as water, mineral spirits/oils, alcohols, and fluorocarbonate derivatives, though various other fluids could also be used, including air, vapor, etc., depending on the required temperature range of operation. For example, in extremely cold environments, a fluid with lower viscosity is a better choice than in extremely hot environments. Various other parameters for choosing a cooling fluid exist and are well known, and therefore will not be discussed in any further detail here.

As evident from FIG. 5, the composite plate 111 lacks an opening in which the cooling fluid within the cooling device 110 is able to directly contact an electronic component intended to be cooled with the device 110. Instead, the device 110 is self-contained with the cooling fluid being hermetically sealed within the cavity 118, such that cooling of an electronic component 124 (FIG. 6) is achieved by thermally contacting the component 124 with one of the plates 112/114. This approach greatly simplifies the installation and maintenance of the device 110.

Thermal contact between the component 124 and plate 114 is shown in FIG. 6 as being promoted with the use of a heat-slug 138, which is preferably formed of a high thermally-conductive material that also has high thermal capacitance, a notable but nonlimiting example of which is copper and its alloys. The heat slug 138 can be defined by a portion of the plate 114, or can be separately formed and then attached to the plate 114. While a small loss in heat transfer is associated with the interfaces 140 and 142 between the heat slug 138 and the plate 114 and component 124, the resistance to heat transfer caused by these interfaces 140 and 142 is relatively minor compared to the resistance encountered when dissipating heat from the cooling device 110 to the environment (typically atmospheric air) surrounding the device 110. Moreover, the heat slug 138 is preferably able to offer sufficient thermal capacitance to buffer transient temperature spikes of the component 124. The thermal capacitance of the slug 138 also overcomes other problems, such as the potential for localized boiling of the cooling fluid in proximity to hot-spots of the component 124, the occurrence of which could greatly reduce the cooling efficacy of the device 110.

Because the cooling fluid assists the plates 112 and 114 in conducting heat from the component 124, the coefficient of thermal conductance of the material(s) used to form the plates 112 and 114 is less important than in structures that rely on passive heat transfer. As such, a wider variety of materials could be used to form the composite plate 111 and its individual components. Moreover, because the plate 111 is hollow, the total amount of material used is substantially lower than in a comparable solid structure, resulting in reduced material costs for manufacturing the cooling device 110. A related issue is the mechanical stability of the cooling device 110. Hollow structures generally exhibit only a minor reduction in rigidity as compared to a solid body of the same dimensions. The rigidity of the device 10 is promoted as a result of the peripheral edges 134 of the plates 112 and 114 being bonded together, as well as bonding of the mesh 116 to both plates 112 and 114. Consequently, the cooling device 110 can be much lighter but yet nearly as strong and rigid as a solid heat spreader of comparable size.

As evident from FIG. 7, the cooling device 110 may include fins 128 to promote heat transfer to the surrounding environment. While fins 128 are shown on only the upper plate 112, the lower plate 114 or both plates 112 and 114 could be so equipped. As known in the art, the fins 128 effectively increase the surface area of the cooling device 110 and, thus, facilitate offloading of the heat to the surrounding environment.

The cooling device 110 may further include a pump 130 as shown in FIG. 9 by which the cooling fluid is recirculated through the cavity 118, generally in a direction or directions parallel to the mesh 116. A wide variety of pumps are possible and suitable for use in the device 110, and the choice of which will be primarily dependent on the specific application since pressure and noise requirements need to be taken into consideration. Notable but nonlimiting examples of suitable pump types include centrifugal, positive displacement, rotary, and osmotic pumps that are commercially available and have been used in prior cooling systems for electronic components. As seen in FIG. 11, the cooling device 110 may also include a combination of fins 128 and pump 130.

FIGS. 9 and 11 depict another aspect of the invention, in which mesh segments 116A and 116B are employed in place of the single unitary mesh 116 of FIGS. 5 through 8. The mesh segment 116A is a primary mesh juxtaposed and preferably directly aligned and over the electronic component 124 for heat uptake, and one or more mesh segments 116B located near the periphery of the device 110 and preferably surround the mesh segment 116A for faster offloading of heat. Heat transfer between the mesh segments 116A and 116B is generally via the cooling fluid and via the plates 112 and 114.

FIGS. 8, 10, and 12 represent, respectively, the use of the devices 110 shown in FIGS. 7, 9, and 11 for dissipating heat from an electronic component 124. In each of FIGS. 8 and 12, a fan 148 is also shown for promoting heat transfer from the fins 128 through forced convection. Otherwise, the device 110 may rely on natural convection to dissipate heat.

Notably, with the inclusion of the pump 130, heat transfer through the cooling fluid is enhanced as a result of the fluid flow becoming turbulent as a result of the fluid being forced to flow through the interstices between the strands 120 of the mesh 116. More particularly, assuming the plate 114 is in thermal contact with the electronic component 124 as shown in FIGS. 6, 8, 10, and 12, heat transfer through the cooling device 110 is by thermal conduction through the plate 114, the mesh 116, and then the plate 112, and by turbulent forced convention between the plate 114 and the cooling fluid and between the cooling fluid and the plate 112, as well as turbulent forced convection through the cooling fluid from the plate 114 to the mesh 116 and turbulent forced convection through the cooling fluid from the mesh 116 to the plate 112. Even so, because the cooling fluid is recirculated through the cooling device 110, heat transfer is through the device 110 is generally through the thickness of the composite plate 111, in other words, from the electronic component 124, through the plate 114, through the cavity 118 containing the mesh 116 and fluid, and then through the plate 112, from whose outer surface heat is dissipated by convection.

FIGS. 13 and 14 depict a variation of the cooling device 110 of FIGS. 5 through 12, modified to include embossed regions 144 within the interior of the cavity 118. The embossed regions 144 are represented as forming walls or dividers within the cavity 118 to define a system of channels 146 in fluidic series. As shown in FIG. 13, the channels 146 define a circuitous route (identified by arrows) for the cooling fluid through the cooling device 110, with flow through the device 110 being maintained at a desired rate with a pump 130. Alternatively, flow may occur opposite the direction indicated in FIG. 13. Another alternative is to use the channel 146 immediately downstream from the pump 130 as a macrochannel or manifold to direct the flow of the cooling fluid in series through the remaining channels 146, or simultaneously in parallel through two or more of the channels 146. The mesh 116 can be a single unit having portions clamped between the embossed regions 144 and the opposing interior surface regions of the plate 114, or can be made up of mesh segments that are each sized to individually fit within one of the channels 146.

While the invention has been described in terms of specific embodiments, it is apparent that other forms could be adopted by one skilled in the art. For example, the functions of the components of the cooling device 110 could be performed by components of different construction but capable of a similar (though not necessarily equivalent) function, the cooling device 110 and its components could differ in appearance and construction from the embodiments shown in the Figures, and appropriate materials could be substituted for those noted. Therefore, the scope of the invention is to be limited only by the following claims.

The invention claimed is:

1. A cooling device comprising:
a first plate and a second plate arranged substantially in parallel and bonded together to define a sealed cavity between the first plate and the second plate, the first plate having an outer surface adapted for thermal contact with at least one electronic component;
a mesh disposed within the sealed cavity and lying in a plane substantially parallel to the first and second plates, the mesh comprising interwoven strands extending between the first plate and the second plate;
a fluid contained and sealed within the sealed cavity;
interstices defined by and between the interwoven strands of the mesh through which the fluid within the sealed cavity is able to flow; and
a pump mounted within the sealed cavity, the pump configured to circulate the fluid within the sealed cavity in a flow direction generally parallel to the first and second plates so that the fluid flow becomes turbulent as the fluid is forced to flow through the interstices.

2. The cooling device according to claim 1, further comprising a plurality of elongate flow dividers within the sealed cavity that connect the first plate to the second plate along the length of each elongate flow divider, the flow dividers placed so as to define fluidically interconnected channels within the composite structure that direct the fluid flow in a serpentine path.

3. The cooling device according to claim 2, wherein the flow dividers are defined by embossed portions of at least one of the first and second plates.

4. The cooling device according to claim 2, wherein the fluidically interconnected channels are interconnected in fluidic series.

5. The cooling device according to claim 3, wherein the second plate is embossed sufficiently to reach across the cavity to engage the first plate so as to define the flow dividers, and the first plate is not embossed to define the flow dividers.

6. The cooling device according to claim 5, wherein peripheral edges of both the first and second plates are embossed, and the first and second plates are bonded together at their embossed peripheral edges.

7. The cooling device according to claim 6, wherein the second plate is flat between its embossed peripheral edges.

8. The cooling device according to claim 1, wherein the composite structure is configured so that heat transfer from the electronic component is through the first plate, through the sealed cavity containing the mesh and the fluid, and through the second plate, from which heat is dissipated by convection to the environment.

9. The cooling device according to claim 1, wherein interwoven strands of the mesh are bonded to the first plate and the second plate.

10. A method comprising:
   absorbing heat dissipated by an electronic component with a first plate arranged substantially in parallel and bonded to a second plate so as to define a sealed cavity between the first and second plates, the first plate having a surface that defines an outer surface of the sealed cavity and is adapted for thermal contact with an electronic component;
   pumping a fluid through a serpentine path formed by embossed dividers within the sealed cavity, the serpentine path extending parallel to the first and second plates;
   transferring the absorbed heat through the sealed cavity and into the second plate via the fluid and a mesh contained in the sealed cavity, the mesh lying in a plane substantially parallel to the first and second plates, the mesh comprising interwoven strands extending between the first and second plates and defining interstices through which the fluid is able to flow, the pump forcing fluid through the interstices so that the fluid flow through the interstices becomes turbulent, the mesh conducting heat from the first plate to the second plate, the turbulent fluid flow convecting heat from the first plate and/or a first portion of the mesh to the second plate at least one of the first portion of the mesh and a second portion of the mesh, the second portion of the mesh spaced from the first plate and the first portion of the mesh; and
   dissipating the absorbed heat to the environment with the second plate.

11. The method according to claim 10, wherein the fluidically interconnected channels are interconnected in fluidic series.

12. The method according to claim 10, wherein the composite structure is configured so that heat transfer from the electronic component is primarily through the first plate, through the sealed cavity containing the mesh and the fluid, and through the second plate, from which the heat is dissipated by convection to the environment.

13. The method according to claim 10, further comprising providing a pump mounted within the composite structure.

14. The method according to claim 10, wherein only the second plate is embossed to define the flow dividers, and the first plate is not embossed to define the flow dividers.

15. The method according to claim 14, wherein peripheral edges of both the first and second plates are embossed, and the first and second plates are bonded together at their embossed peripheral edges.

16. The method according to claim 15, wherein the second plate is flat between its embossed peripheral edges.

17. The method according to claim 10, wherein interwoven strands of the mesh are bonded to the first plate and the second plate.

18. A cooling device comprising:
   a first plate and a second plate arranged substantially in parallel to one another and bonded together along bonding edges so as to define a sealed cavity between the first and second plates, the first plate having a surface that defines an outer surface of the sealed cavity and is adapted for thermal contact with an electronic component;
   a fluid contained and sealed within the sealed cavity;
   means for thermally connecting the first and second plates via thermal conduction in the sealed cavity between the bonding edges, the fluid within the sealed cavity contacting and flowing across the means for thermally connecting the first and second plates via thermal conduction, the fluid absorbing heat by thermal convection from the first plate and the means for thermally connecting the first and second plates via thermal conduction, and thermally convecting the heat to the second plate; and
   means for dividing the sealed cavity into fluidically interconnected channels that direct a fluid flow in a serpentine path within the sealed cavity.

* * * * *